United States Patent
Salvesen et al.

(10) Patent No.: US 7,429,740 B2
(45) Date of Patent: Sep. 30, 2008

(54) ELECTRIC-MAGNETIC FIELD-GENERATING ELEMENT AND ASSEMBLING METHOD FOR SAME

(75) Inventors: Carlo Salvesen, Massing (DE); Ralf Degenhardt, Landsham (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 207 days.

(21) Appl. No.: 11/483,804

(22) Filed: Jul. 10, 2006

(65) Prior Publication Data

US 2007/0023673 A1 Feb. 1, 2007

(30) Foreign Application Priority Data

Jul. 11, 2005 (EP) ................... 05015009

(51) Int. Cl.
*H01J 1/50* (2006.01)
(52) U.S. Cl. ............... 250/396 ML; 335/210; 335/213; 250/522.1; 250/492.2; 29/602.1
(58) Field of Classification Search ............ 335/210, 335/213; 29/602.1; 250/522.1, 396 ML, 250/396
See application file for complete search history.

(56) References Cited

U.S. PATENT DOCUMENTS 4,962,313 A    10/1990   Rose
5,021,670 A *  6/1991   Lanio et al. ............. 250/396 R
6,483,110 B1 * 11/2002   Kaneyama ................. 250/305
6,593,578 B1 *  7/2003   Duval et al. ........... 250/396 ML
2004/0144931 A1 * 7/2004  Harris ..................... 250/492.2

FOREIGN PATENT DOCUMENTS

EP        1045425 A2    10/2000
JP        08017626       * 8/1996

OTHER PUBLICATIONS

European Search Report dated Jul. 4, 2006.
M. Haider et al. "Design and test of an electric and magnetic dodecapole lens." Optik. 1982 vol. 63(1): pp. 9-23.

* cited by examiner

*Primary Examiner*—Kimberly D Nguyen
*Assistant Examiner*—Brooke Purinton
(74) *Attorney, Agent, or Firm*—Patterson & Sheridan, LLP (57) ABSTRACT

An electric-magnetic field-generating element and a multi-pole element comprising a plurality of these field-generating elements providing for a stable charged particle beam are described. For some embodiments, the electric-magnetic field-generating element includes a pole piece, a yoke to which the pole piece is attached, at least one coil, a vacuum-tight container accommodating the coil(s), and a holder adapted to hold the vacuum-tight container such that the vacuum-tight container is spaced from the pole piece and the yoke.

28 Claims, 6 Drawing Sheets

ELECTRIC-MAGNETIC FIELD-GENERATING ELEMENT AND ASSEMBLING METHOD FOR SAME

CROSS-REFERENCE TO RELATED APPLICATION

This application claims priority to European Patent Application No. 05015009.3 filed Jul. 11, 2005, which is herein incorporated by reference.

FIELD OF THE INVENTION

The invention relates to an electric-magnetic field-generating element and a multipole element comprising a plurality of such field-generating elements.

BACKGROUND OF THE INVENTION

Technologies like microelectronics, micromechanics, and biotechnology have created a high demand in industry for structuring and probing specimens on the nanometer scale. On such a small scale, probing or structuring (e.g., of photomasks) is often done with electron beams that are generated and focused in electron beam devices, such as electron microscopes or electron beam pattern generators. Electron beams offer superior spatial resolution compared to photon beams due to their short wave lengths at a comparable particle energy.

One example of optical devices used in such an electron beam apparatus are round lenses. Round lenses are used for focusing the corpuscular beams in conventional electron microscopes, electron and ion beam registration devices, and ion processing and implantation devices in addition to electron beam measuring devices. The geometry of these lenses, which produce rotationally symmetrical electric and/or magnetic fields, is optimized to small aberration constants. In systems where rotationally symmetric electric or magnetic fields that are not time-dependent and are free of space charge are used exclusively to produce the lens effect, the spherical aberration of the third order and the axial chromatic aberration of the first order (first degree) cannot be corrected in principle. For electrostatic fields, a zone having less than cathode potential acts like an electrostatic mirror reflecting the electron beam. Therefore, these aberrations limit the resolution and a correction thereof is only possible if one of the restrictions regarding the fields is waived (e.g., by introducing non-round symmetries).

Multipole elements (e.g., quadrupoles) are used, for example, as adjustment means or stigmators in electron microscopes. For these elements, the requirements regarding the shape of the field-generating components (pole pieces, electrodes), the accuracy of the adjustment to the optical axis, and the long- and short-term stability are in any case substantially less than for systems for correction or reduction of spherical and chromatic aberrations. However, a high degree of accuracy is also desirable for adjustment components.

For example, Wien filters (see W. Wien, Ann. Phys. 65 (1898), page 444) can be used as correctors for charged particle beam optical systems. In such a Wien filter, electrodes and magnetic poles are simultaneously utilized to create both an electric field and a magnetic field. The two fields are tuned, or adjusted, to apply equal but opposite forces to charged particles having a certain nominal energy in the incident beam on the optical axis, so that these particles of nominal energy are not deflected. To improve the imaging properties of Wien filters, quadrupole or even multipole elements of higher order are added to the Wien filter, thus rendering the Wien filter a multipole element.

The design, manufacturing, and assembly of such combined electric-magnetic multipole elements impose extremely high requirements on dimensional precision, positioning accuracy, and stability during operation of the device comprising the multipole element. The difficulties to meet these requirements for electric-magnetic multipoles are further enhanced by the fact that the electrodes, which also serve as pole pieces, have to be placed directly within the vacuum.

In the combined electric-magnetic multipole elements, which are known from Optik 60, No. 3 (1982) page 307 to 326, the parts arranged in the vacuum (i.e., the pole pieces and the electrodes), the excited individual windings fixed on the pole piece mounting, and the supply lines are cast integrally in synthetic resin (e.g., epoxy resin) in order to reduce the gas emitting surface. However, this embedding technique has the disadvantage that, in spite of maintaining its hardness for months in a vacuum, the synthetic resin as well as the varnish of the wires, emits gas. Furthermore, the resin shrinks and becomes brittle, and this deformation influences the magnetic properties of the multipole element. In addition, costly shielding of the epoxy resin is necessary in order to avoid charging by the corpuscular beam which is difficult to realize due to its complex design. Also, the integrally formed structure of this prior art multipole element is disadvantageous in terms of maintenance and readjustment or repair because the whole element has to be replaced or readjusted instead of, for example, only the pole piece and electrode.

Due to the problems described above associated with exposing the coils to the vacuum, it is desirable to place the coils for exciting the magnetic field outside the vacuum. Hence, the introduction of a vacuum-tight separation of the coils is advantageous. Also, the electrodes have to be electrically insulated from each other and from the coils when the electrodes also serve as pole pieces. Typically, the vacuum-tight seal is provided by a welding or brazing technique or by means of a gluing or molding process. Also, O-rings are used, either alone or in combination, with some of the aforementioned techniques for providing a vacuum-tight seal.

In U.S. Pat. No. 5,021,670, the coil is mounted to an elongated part of the electrode and pole piece, located outside the beam tube. A vacuum seal is formed by metal-ceramic bonds or metal caps which are soldered to the elongated parts of the electrodes and pole pieces.

In U.S. Pat. No. 6,593,578, the elongated electrodes and pole pieces are inserted into a support structure made of ceramic. The coils are mounted on the elongated electrodes and pole pieces, outside the beam tube on spools. A vacuum-tight seal between the beam tube and the ceramic support structure is provided by brazing the pole pieces to the ceramic support structure.

However, it is difficult to maintain the positioning accuracy of the individual electrodes and pole pieces when a brazing technique is adopted. In this case, the vacuum-tight seal is formed by a metal-ceramic bond created by welding or brazing. Thus, the ceramic material is locally subject to high temperatures. These high temperatures induce tension forces in the ceramic-metal joint resulting in instabilities of the joints or even deformations. As a result, the optical properties of the multipole element deteriorate due to mechanical instabilities of the metal-ceramic joints. Also, the alignment accuracy of the pole pieces and electrodes deteriorates due to such mechanical instabilities. Furthermore, brazing is difficult because of the different thermal expansion coefficients of the metal and ceramic materials involved. In the case of a brazing or soldering technique, the even distribution of the soldering flux is a complicated problem. Moreover, these problems become even more critical when they have to provide a vacuum-tight seal. Glues or resins do not provide adequate alternatives since they suffer from the disadvantages mentioned above: a high outgassing rate, degradation during vacuum operation, and shrinking.

Furthermore, all the prior art solutions outlined above have in common the problem that during operation, particularly at higher excitation of the coils, the heat created by the coils causes mechanical instabilities and deformations of the metal-ceramic joints resulting in deformations of the electromagnetic field and, thus, drifts and instabilities of the charged particle beam. However, in some applications it is especially desirable to excite a multipole element up to a point where particles entering the multipole element follow oscillating trajectories inside the multipole element. For this purpose, relatively high excitation of the multipole element is necessary.

Accordingly, there is a need to overcome the disadvantages associated with the prior art.

SUMMARY OF THE INVENTION

Embodiments of the present invention provide for an electric-magnetic field-generating element and a multipole element in an effort to overcome the aforementioned disadvantages. Further advantages, features, aspects, and details of these embodiments are evident from the dependent claims, the description, and the accompanying drawings.

In the context of the present application, the term "electric-magnetic field-generating element" comprises elements for the generation of purely magnetic fields as well as elements for the generation of electromagnetic fields. Therefore, in the following description the reference to a pole piece, which is used for generating a purely magnetic field, should be understood also as a reference to an element combining a pole piece with an electrode and, thus, being designed for generating an electromagnetic field. Exceptions to this rule will be expressly mentioned where necessary.

One embodiment of the present invention provides an electric-magnetic field-generating element. The electric-magnetic field-generating element generally includes a pole piece, a yoke connected with the pole piece, at least one coil, a vacuum-tight container accommodating the at least one coil, and a holder adapted to hold the vacuum-tight container such that the vacuum-tight container is spaced from the pole piece and from the yoke.

Another embodiment of the present invention provides a multipole element. The multipole element generally includes a plurality of field-generating elements, wherein each field-generating element generally consists of a pole piece, a yoke connected with the pole piece, at least one coil, a vacuum-tight container accommodating the at least one coil, and a holder adapted to hold the vacuum-tight container such that the vacuum-tight container is spaced from the pole piece and from the yoke.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE DRAWINGS

Figure 1:
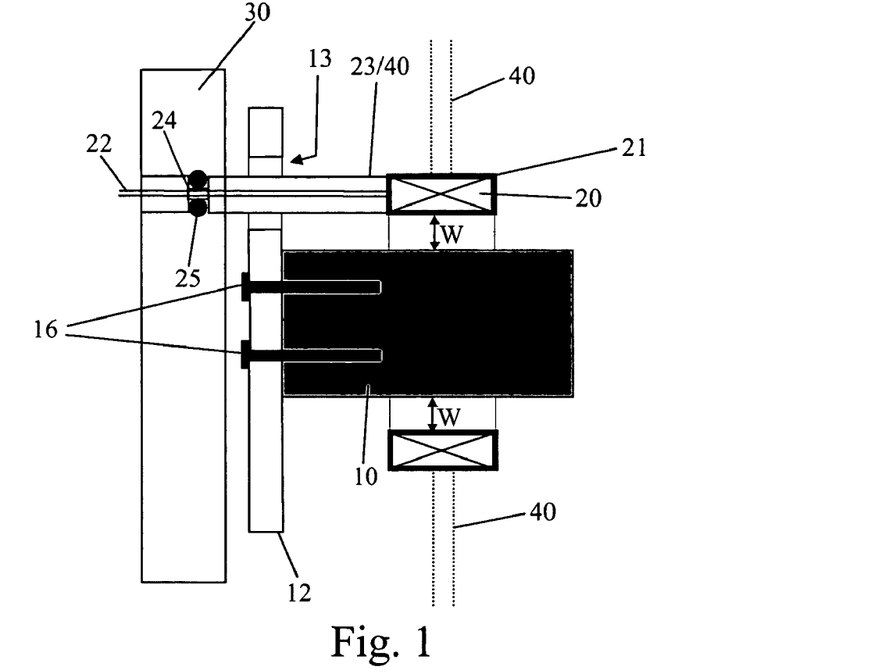
FIG. 1 shows a field-generating element according to an embodiment of the present invention.

FIG. 1 shows an electric-magnetic field-generating element according to an embodiment of the present invention. The electric-magnetic field-generating element shown in FIG. 1 may comprise a pole piece 10 which may be attached to a yoke 12 for guiding the magnetic flux. The pole piece 10 may be attached to yoke 12 by screw bolts 16. The field-generating element may generate a magnetic field by use of a coil 20 accommodated in a container 21. Container 21 should be formed in a vacuum-tight manner so that it seals coil 20 against the vacuum in the column of the charged particle beam. Typically, the container may be sealed in a vacuum-tight manner by welding, soldering, or brazing. Additionally or alternatively, O-rings or metal gaskets can also be used for the vacuum-tight seal. Inside container 21, coil 20 should be at atmospheric pressure. The container 21 may surround the pole piece 10 which guides the magnetic flux generated by coil 20. Pole piece 10 and container 21 may be spaced by a clearance of width W. The width W can be mainly determined by two factors: electric strength with respect to high voltages and machining tolerance. Accordingly, the width W should be chosen so that the resulting configuration has sufficient electric strength even for high voltages occurring together with high coil excitations. Thereby, the machining tolerance should be taken into account so that a minimum clearance is provided. For some embodiments, a typical value for width W is 3 mm for a field-generating element with a height of 50 mm to 100 mm. Furthermore, container 21 may also be spaced by a clearance from the yoke 12. To maintain container 21 in a position spaced from the pole piece 10 and the yoke 12, a holder 40 may be provided.

The embodiment of FIG. 1 shows alternative realizations of the holder 40. As a first alternative, a duct 23 may be mounted between container 21 and a column housing 30 of the charged particle beam apparatus. Duct 23 may extend horizontally from container 21 through an opening 13 in the yoke 12 to the column housing 30. The cross section of opening 13 should be larger than the cross section of duct 23 so that duct 23 is spaced from yoke 12. Duct 23 may provide a vacuum-tight conduit between the inside of container 21 and the atmosphere outside the column housing 30. Therefore, a seal 25, such as an O-ring or a metal gasket, may be provided between duct 23 and column housing 30. Duct 23 may be formed as a rigid tubular member so that it can hold container 21 in a predetermined position. Thus, duct 23 may serve as a holding member 40 for container 21. The duct 23 may be formed integrally with the container 21 by primary forming or may be attached to it by brazing or welding techniques. Furthermore, duct 23 may be composed of heat-conducting material so that it further provides heat transfer from the vacuum-tight container 21 to the housing 30 or to the outside of the charged particle apparatus. Another possibility may be to provide super-conducting coils within vacuum-tight container 21. Then, coolant supply for the super-conducting coils can be provided by duct 23. Accordingly, duct 23 may be designed to transfer heat from the inside of container 21 to the column housing and the outside of the column by conductance and/or convection.

As a further alternative, the holder 40 may also be provided by an upwardly extending member 40 shown in dotted lines in FIG. 1. Upwardly extending member 40 can be attached to column housing 30 or to a plate member (not shown) located above the field-generating element. Alternatively, the holder 40 may also be provided by a downwardly extending member 40 also shown in broken lines in FIG. 1. Downwardly extending member 40 can be attached to column housing 30 or to a bottom plate member (not shown) located below the field-generating element. Both the upwardly and downwardly extending members 40 may be formed as simple solid rods or as ducts similar to horizontally extending duct 23 described above. Furthermore, duct 23 can be provided in addition to the vertically extending holder 40. In this case, the duct 23 may be formed as a flexible vacuum-tight hose since rigidity of the duct should not be required.

In the embodiment shown in FIG. 1, supply lines 22 for the coil 20 may be accommodated within duct 23, wherein the supply lines 22 may be connected to current drivers (not shown) outside column housing 30. The supply lines 22 may be guided from the inside of column housing 30 to the outside via a feed-through 24 which should be tightly vacuum-sealed by a seal 25. Seal 25 may be formed as an O-ring or a metal gasket and may be selected according to the specific requirements of the apparatus as long as it provides vacuum-tight sealing.

The electric-magnetic field-generating element described above may have the following advantages over conventional designs. Since the container 21 of coil 20 is not in contact with the pole piece 10 and the yoke 12, no direct heat transfer from the coil 20 to pole piece 10 and yoke 12 should occur. Thus, misalignment and instabilities of the pole piece 10, especially at higher coil excitations, should be prevented so that, in turn, drifts and instabilities of the charged particle beam resulting from such misalignment and instabilities should be avoided. Consequently for higher coil excitations, the field-generating element can be either built more compact (i.e., shorter in height), or, alternatively, for a given height of the field-generating element, a more stable charged particle beam, and therefore better performance, can be achieved. Since the duct 23 connects the coil 20 directly to the column housing, the thermal load generated by the coil 20 may be directly transferred outside the column 30 and to the column housing 30, especially when the coil 20 is at atmospheric pressure and the excitation of the coil is high. Thus, an effective heat transfer mechanism for the coil may be established, and water-cooling can be considered dispensable.

Figure 2:
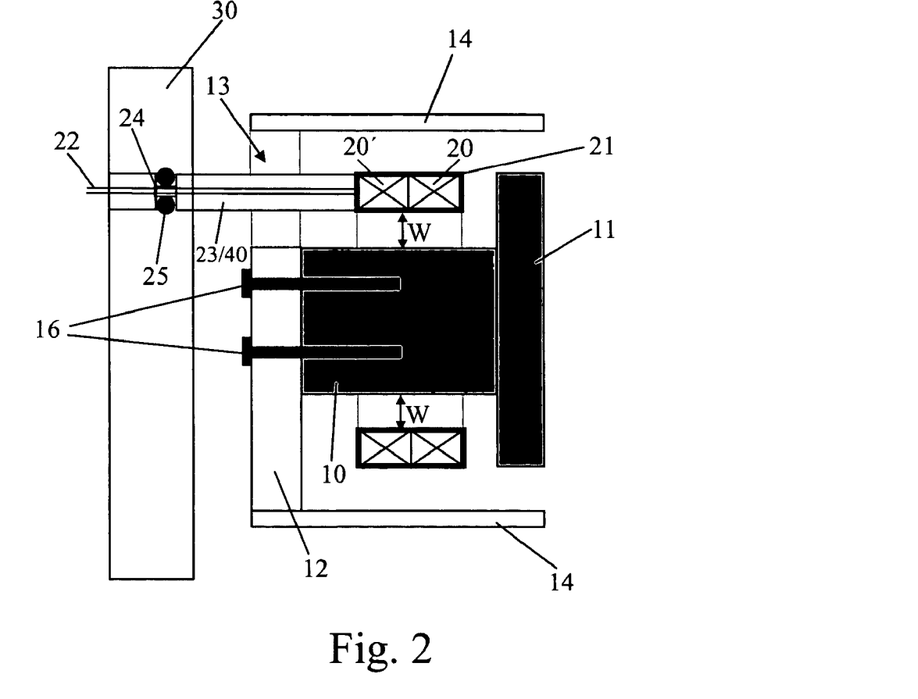
FIG. 2 shows a field-generating element according to another embodiment of the present invention.

FIG. 2 shows a field-generating element according to another embodiment of the present invention. It is similar to the embodiment shown in FIG. 1 but has a more complex design. In addition to the elements described with reference to FIG. 1, the embodiment shown in FIG. 2 may comprise a front pole piece 11 attached to the pole piece 10. Typically, the front pole piece 11 and the pole piece 10 may be integrally formed. However, front pole piece 11 may be elongated in an effort to shield the coil 20.

Furthermore, an additional coil 20' may be disposed in the container 21. Coil 20' can be used to provide a corrective magnetic field. It should be understood that even more additional coils may be provided in container 21 and that the cross-sectional shape of container 21 may be adapted to the number and shape of the coils within.

At the upper and lower ends of yoke 12, shielding plates 14 may be provided. Shielding plates 14 may limit the extension of internal magnetic fringe fields. In case electrostatic fields are also generated by the field-generating element as in the embodiments described below, field shields 14 may also limit the extension of the electrostatic field. Thus, the influence of these fringe fields onto the charged particle beam should be minimized, and the optical properties should not be deteriorated.

Since the container 21 and the duct 23 are not only spaced from the pole piece 10, 11 in the embodiment described above, but also from other parts of the field-generating element like the yoke 12 and the shielding plates 14, mechanical deformations due to the heat load generated particularly by a highly excited coil can almost be excluded. In case of upwardly or downwardly extending holder 40, openings should be provided within a respective shielding plate 14, wherein the cross section of the opening should be larger than the cross section of the holder so that no heat transfer from the holder to the shielding plate 14 occurs.

Figure 3:
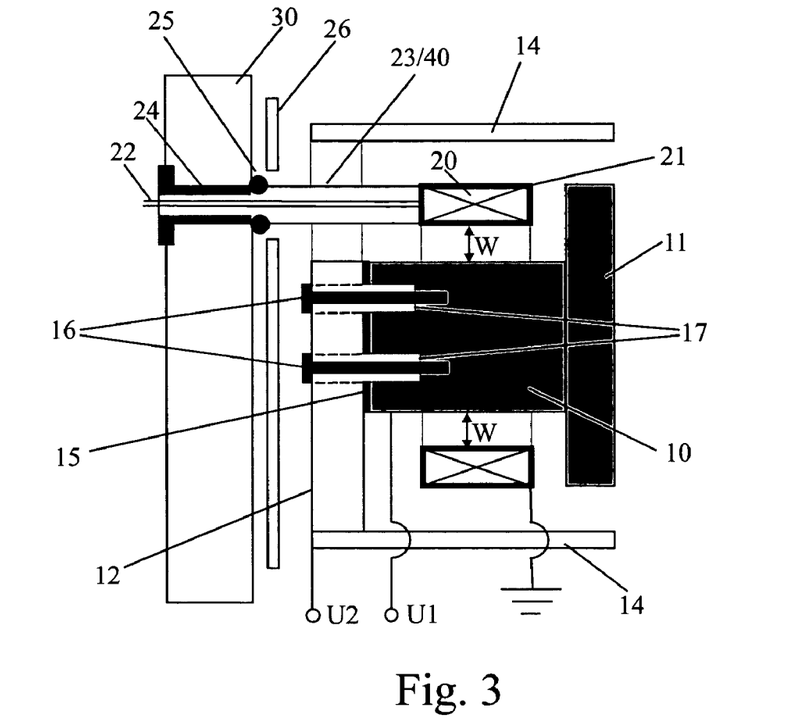
FIG. 3 shows a field-generating element according to a further embodiment of the present invention.

FIG. 3 shows a field-generating element according to a further embodiment of the present invention. This embodiment differs from the embodiment shown in FIG. 2 in some aspects. A first difference is that the pole pieces 10, 11 may also serve as electrodes for generating an electrostatic field. For this purpose, pole piece 10 may be connected to a voltage source by a supply line. Thus, a voltage U1 can be applied to pole piece 10, 11. Alternatively, the electrical connection can also be made at pole piece 11 or via the screw bolts 16 for attaching the pole piece 10, 11 to the yoke 12. In either case, the connection lines to the voltage source may be guided out of the charged particle apparatus through duct 23 or by other means. When pole pieces 10, 11 simultaneously serve as electrodes, yoke 12 should be electrically insulated from the combined pole piece/electrode 10, 11. For this purpose, an insulating foil 15 may be disposed between yoke 12 and combined pole piece/electrode 10, 11. Typically, this insulating foil may be made of polyimide available from DuPont under the trademark name Kapton. Typically, the combined pole piece/electrode may be attached to the yoke by screw bolts 16 which can be inserted into ceramic bushings 17 extending through the yoke (dashed lines) in an effort to electrically insulate the screw bolts therefrom. The ceramic bushings 17 may be further extended into bores provided at a rear surface of the combined pole piece/electrode. Typically, the ceramic bushings 17 should be manufactured with very high precision and should be tightly-fitting into the bores so that the pole pieces/electrodes can be also positioned with very high accuracy.

The above described electric-magnetic field-generating element may be capable of generating a magnetic and an electrostatic field. Since the coils 20, 20' and the electrodes 10, 11 may be supplied by individual current/voltage sources, the magnetic and electrostatic fields generated by the element can be individually adjusted. Therefore, this electric-magnetic field-generating element is predestined for use in an electric-magnetic multipole element.

Furthermore, the embodiment shown in FIG. 3 may have an additional shield 26 disposed between the yoke 12 and column wall 30. Shield 26 may protect the field-generating element against external fields which may influence and deteriorate the field generated by the field-generating element. Like yoke 12, shield 26 also may have an opening through which duct 23 can be guided. Similarly, this opening may be spaced from duct 23 so that no heat transfer between duct 23 and the shield 26 should occur. It should be understood that shield 26 is an optional feature and may also be added to other embodiments of the present invention, especially the embodiments shown in FIGS. 1 and 2.

Moreover, FIG. 3 shows an optional arrangement for affixing duct 23 to the column 30 and for guiding supply lines 22 to the exterior of the column. As shown in FIG. 3, duct 23 can be affixed from the outside of the column 30.

Furthermore, in any of the above described embodiments, the magnetic circuit formed by the yoke 12 and/or the shielding plates 14 may be connected to a voltage source U2 to bring the magnetic circuit to a predetermined potential. However, in this case, it may be important to take into account the potential difference between the magnetic cage and the holder 40 when dimensioning the cross sections of the openings in the yoke 12 and/or the shielding plates 14. Otherwise, undesirable electrical discharge may occur.

Figure 4:
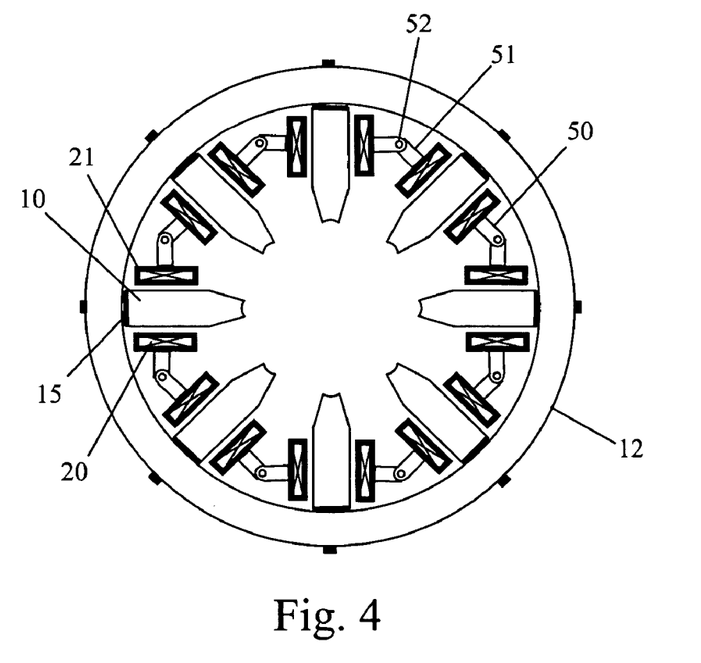
FIG. 4 shows a cross section of a multipole element according to another aspect of the present invention.

FIG. 4 shows a cross-section of a multipole element assembled from electric-magnetic field-generating elements. Therein, eight field-generating elements according to the above embodiment of the present invention may be arranged with eightfold symmetry around the optical axis. The number eight should be understood to be exemplary, but typically the number of field-generating elements of a multipole element is even. Each of the vacuum-tight containers 21 of the coils 20 may have at least one flange 50, 51 on either side thereof configured for connection with an adjacent container. Flanges 50 may be located above flanges 51 when seen in an axial direction of the column. Each of the flanges 50, 51 may have an opening through which a screw bolt 52 can be inserted. When assembling the multipole element shown in FIG. 4, the flanges 50, 51 of adjacent field-generating elements may be aligned so that their openings overlap. Then, a screw bolt 52 can be inserted into the openings and fixed. Thus, each of the containers 21 may be detachably affixed to its neighboring containers and, as a result, a self-supporting structure may be achieved. According to a further embodiment of the present invention, adjacent vacuum-tight containers 21 may be electrically connected by microconnectors (not shown). For example, these microconnectors can be comprised in the above-described flange structures. Due to the microconnectors, the vacuum-tight containers 21 may be electrically connected to each other so that it is not necessary that each container 21 has its own duct 23 for leading the supply lines to the outside of the housing 30. Instead it is possible that a duct 23 may be attached to only a single container 21 and that the coils in the remaining containers may be supplied via the microconnectors.

Since the electric-magnetic field-generating elements may be detachably connected to each other and since the individual components of each of the electric-magnetic field-generating elements may be detachably connected to each other, the multipole element can be fully disassembled and, if desired, later reassembled due to this modular design. Therefore, maintenance and replacement of parts should be facilitated. Furthermore, the adjustment and alignment accuracy should not deteriorate due to disassembly so that the field-generating elements of the multipole element may be readjusted after maintenance or replacement with the same precision as during initial assembly. For example, in a multipole element having outer dimensions of 100 mm, the pole pieces can be adjusted with an accuracy of 5 µm.

Figure 5:
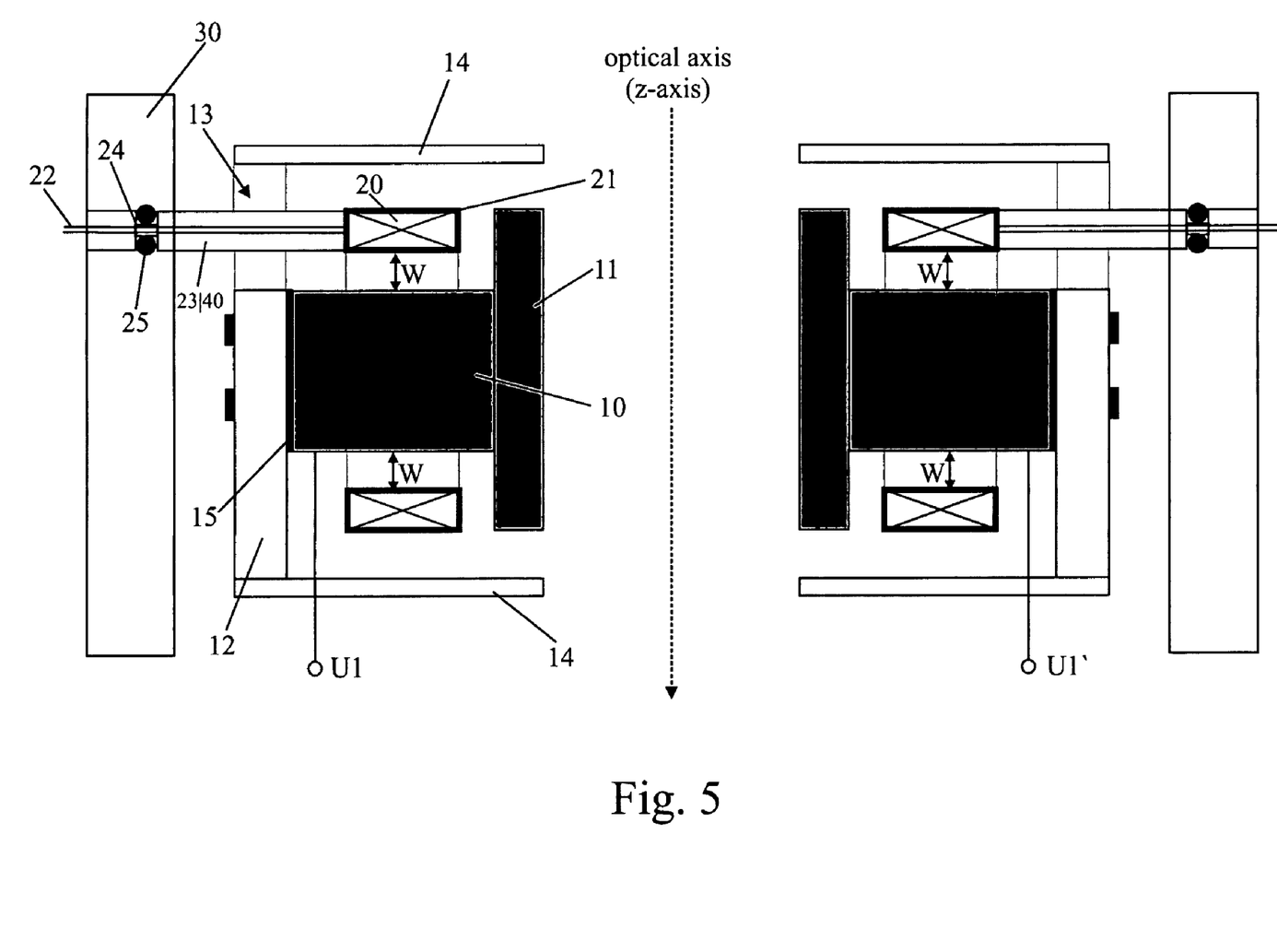
FIG. 5 is a view of a multipole element according to an embodiment of the present invention.

FIG. 5 is a cross sectional view of the multipole element shown in FIG. 4. It should be apparent from FIG. 5 that each individual electric-magnetic field-generating element has the configuration of the embodiment shown in FIG. 3. Especially, the voltage and/or current supply can be individually controlled and adjusted for each of the field-generating elements and for each coil and electrode of an individual field-generating element. Thus, very accurate and complex field patterns can be generated. Since the coils 20 may be accommodated in their vacuum-tight containers 21 and may be spaced from the combined pole pieces/electrodes 10, 11, the precision of the field generation can also be maintained at higher coil excitations when considerable heat load is generated. Then, the heat may be transferred outside the column via the container 21 and the duct 23 without causing mechanical instabilities or misalignments of other parts of the multipole element.

Figure 6:
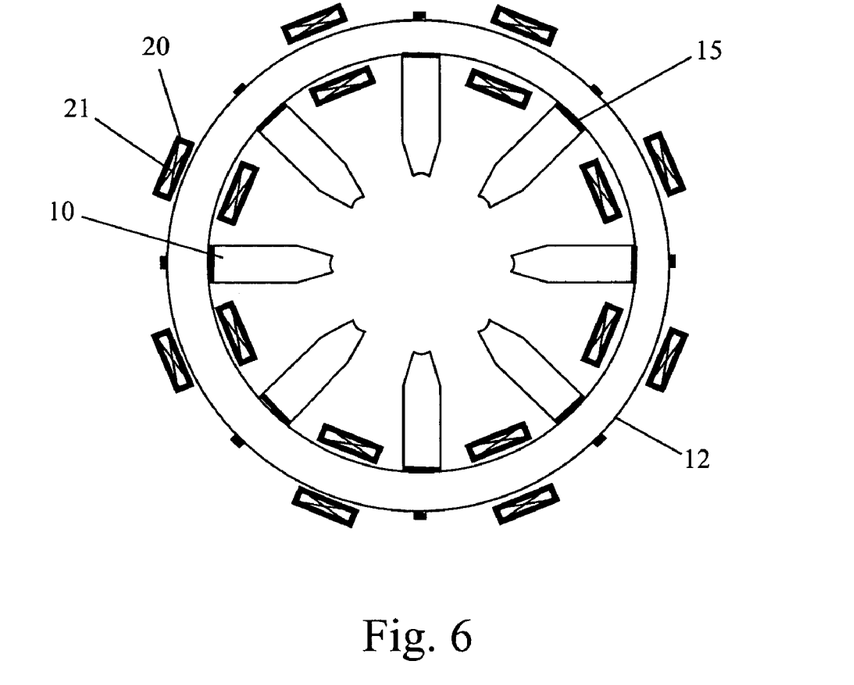
FIG. 6 shows a multipole element according to a further embodiment of the present invention having a different arrangement of the vacuum-tight containers.

An alternative embodiment of the multipole element of FIG. 4 is shown in FIG. 6. Therein, the vacuum-tight containers 21 may be mounted on the yoke 12 instead of on the pole pieces 10. In this embodiment, it should not be necessary to provide through holes 13 for holders in the yoke 12. However, the yoke 12 may be adapted to be opened so that it can be inserted into the central opening of the container 21.

Figure 7A:
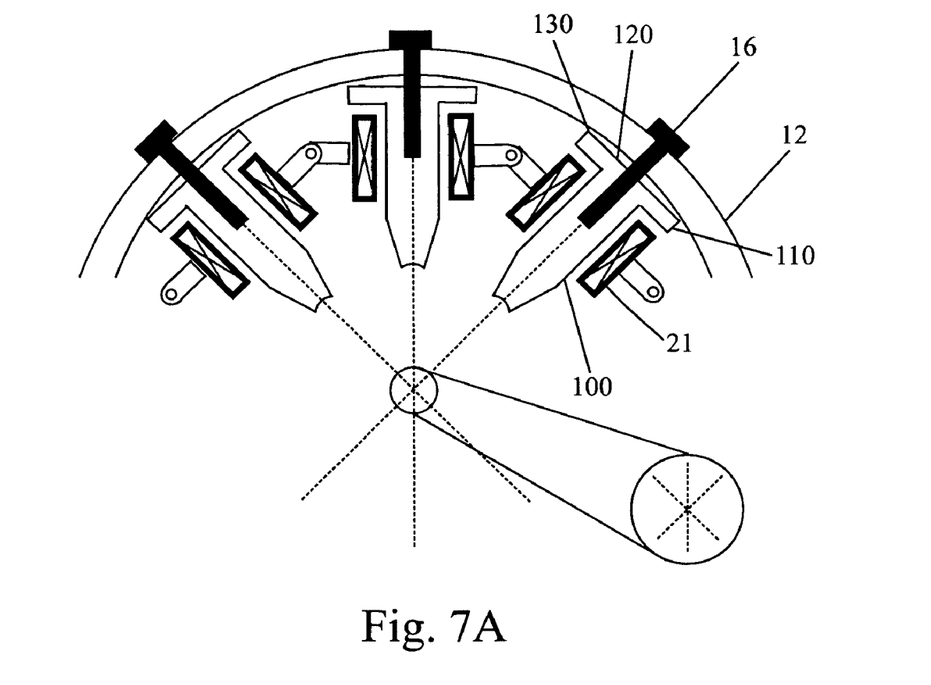
FIGS. 7A and 7B show a partial view of a multipole element according to an embodiment of the present invention.
Figure 7B:
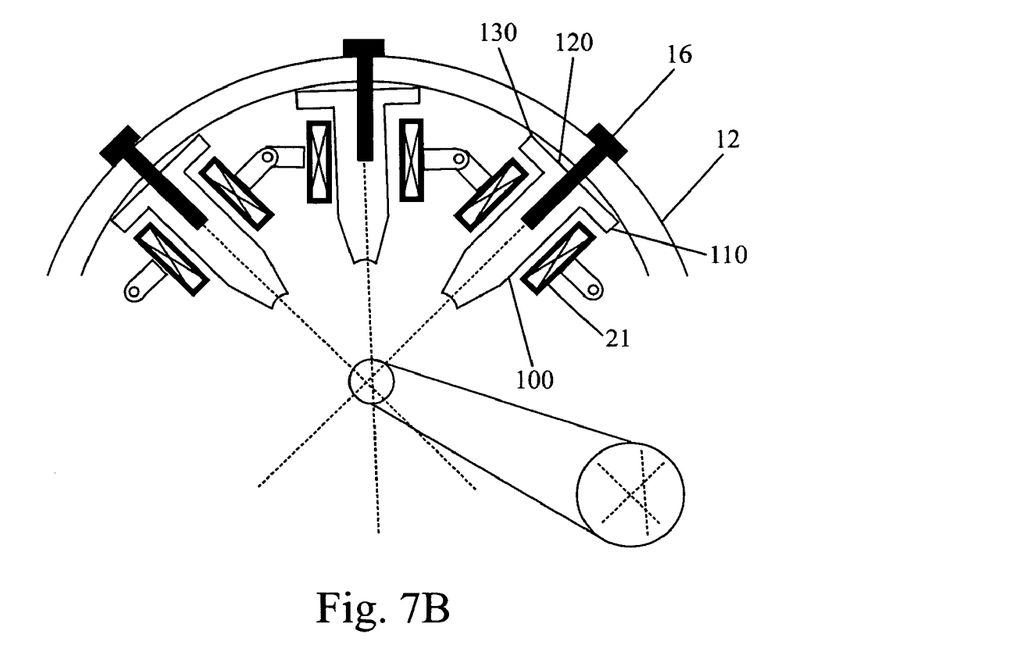

A further aspect of the present invention relates to the alignment of the field-generating elements and is now described with reference to FIGS. 7 to 11. FIG. 7A shows an enlarged view of an arrangement of field-generating elements, similar to the arrangement shown in FIG. 4. The pole pieces shown in FIG. 7A may be correctly aligned so that their imaginary axes (dashed lines) meet at a single point (see the enlarged inset of FIG. 7A). FIG. 7B shows a case where the middle pole piece is not correctly aligned. Therefore, its imaginary axis should not extend through the center point (see the enlarged inset of FIG. 7B). As a result, the field geometry (i.e., the symmetry) of the multipole element of FIG. 7B is distorted. Consequently, such a distortion of the field geometry should be avoided by ensuring that the pole pieces 100 are correctly aligned.

In the prior art apparatus (e.g., that of U.S. Pat. No. 6,593,578), the alignment of the pole pieces was achieved by inserting the pole pieces into a ceramic ring to which the pole pieces are brazed. In a multipole element according to an embodiment of the present invention, the ceramic ring may be omitted. Therefore, the alignment of the pole pieces may be adjusted through a proper design of the rear surface of the pole pieces as will be described below.

In FIG. 7A, each of the field-generating elements may be configured according to another embodiment of the present invention and comprises a pole piece 100 having a laterally extended rear portion 110. The rear portion 110 may have a rear surface 120 facing a cylindrical yoke 12. The yoke 12 may comprise several parts or may be integrally formed. If the yoke 12 comprises several parts, the yoke could be parted vertically, horizontally, or in any other desired direction. In the embodiment shown in FIG. 7A, the rear surface 120 is in contact with yoke 12 only at specific contact regions 130. These contact regions 130 may define the spatial alignment of the pole piece and, thus, can be important for the field geometry provided by a multipole element formed from such pole pieces. Therefore, a proper design of the contact regions 130 at the rear surface 120 may provide proper alignment of the pole pieces 100. Thus, it is possible to control the alignment accuracy through a design and manufacturing process. The difficulty in controlling a metal-ceramic brazing process can be avoided. Furthermore, the misalignment at the front surface of the pole piece 100 may be very small compared to the misalignment at the rear surface 120 due to the aspect ratio of the pole piece 100. Thus, the alignment can be provided with higher accuracy compared with the prior art apparatus.

Figure 8:
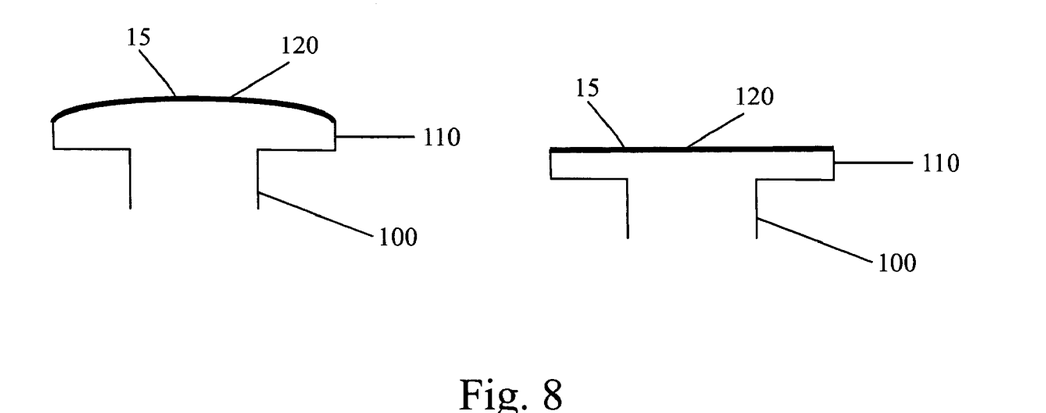
FIGS. 8 to 11 show different embodiments of a pole piece rear surface according to embodiments of the present invention.
Figure 9:
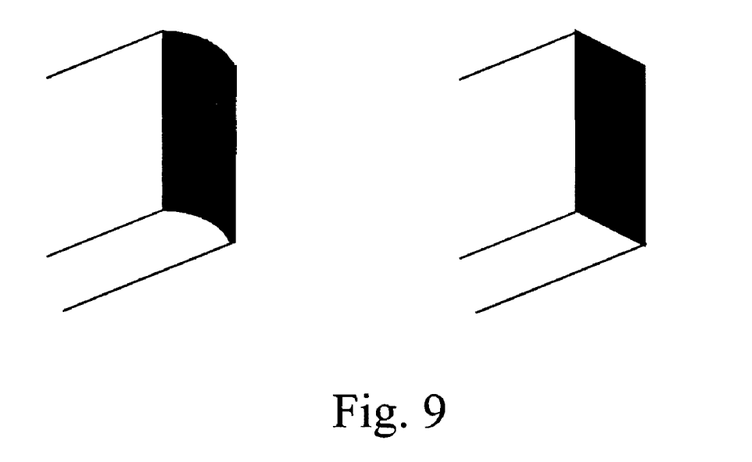

FIG. 8 shows two different basic shapes of the rear surface 120. On the left hand side of FIG. 8, according to one embodiment, the rear surface 120 has the shape of a circular arc. A perspective view of the curved rear surface 120 is shown on the left hand side of FIG. 9. The curvature of rear surface 120 may be adapted to the curvature of the inner surface of the cylindrical yoke 12. Thus, rear surface 120 may fit the inner surface of yoke 12. The contact region of the rear surface 120 may be covered with any suitable insulating material 15, such as Kapton foil, for electric insulation of pole piece 100 and yoke 12. Alternatively, an insulating foil 15 may be inserted between the rear surface 120 and the yoke 12.

On the right hand side of FIG. 8, according to another embodiment, the rear surface 120 has a planar shape as shown in FIGS. 7A and 7B. A perspective view of the planar rear surface 120 is shown on the right hand side of FIG. 9. When used with a cylindrical yoke, only the outermost left and right regions of the planar rear surface 120 should contact the yoke (see FIGS. 7A and 7B). However, the yoke 12 may also be polygonal and, thus, planar on its surface opposing rear surface 120 of the pole piece 100.

Also, the yoke 12 may have planar recesses into which the rear surface 120 of the pole piece fit. In this case, the yoke 12 itself may have an arbitrary shape. However, in this case, the upper, lower, and side surfaces of the pole piece should also be covered with insulating material.

According to another embodiment, only the outermost left and right portions of the rear surface 120 may be curved whereas the center portion between may be planar.

Figure 10:
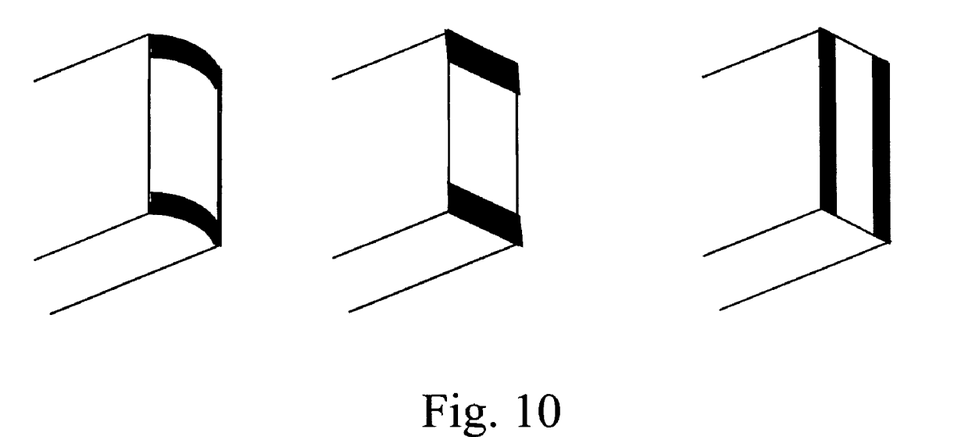

A further embodiment of the present invention is shown in FIG. 10 where only specific regions (i.e., stripes) of the rear surface 120 may be provided as contact regions. These regions may be elevated with respect to the rest of rear surface 120 so that contact between the pole piece 100 and the yoke 12 may only be made at these contact regions. The regions may be formed as horizontal or vertical stripes.

Figure 11:
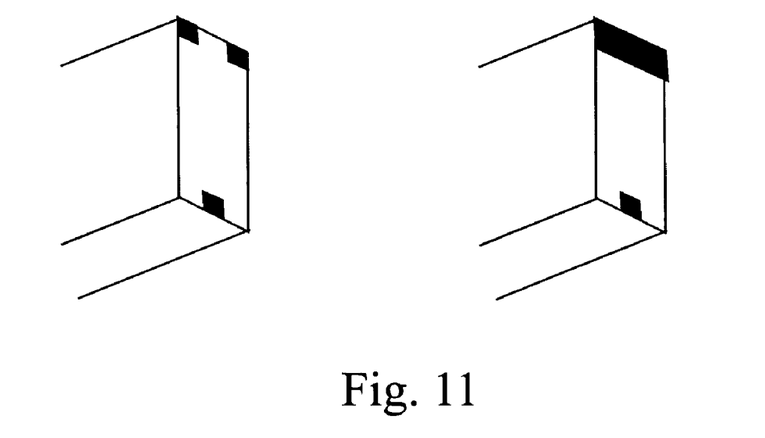

An even further embodiment of the present invention is shown on the left hand side of FIG. 11 where the elevated contact regions may be point-shaped as opposed to stripe-shaped. In the specific example shown in FIG. 11, three points may serve as contact regions between the pole piece 100 and the yoke 12. However, any number of point-shaped contact regions, as well as any combination with stripe-shaped contact regions, may be selected according to the specific application. An example of a combination with a horizontal stripe in the upper portion of the back surface and a single point in the lower portion of the rear surface 120 of the pole piece 100 is shown on the right-hand side of FIG. 11 according to one embodiment.

It should be understood that in the embodiments shown in FIGS. 8 to 11, the contact between the rear surface 120 of the pole pieces 100 and the yoke 12 may not necessarily be a direct contact but can also be an indirect contact. For example, an insulating foil may be placed between the rear surface of the pole piece/electrode and the yoke 12.

The invention claimed is:

1. An electric-magnetic field-generating element, comprising:
   a pole piece;
   a yoke connected with the pole piece;
   at least one coil;
   a vacuum-tight container containing the at least one coil; and
   a holder adapted to hold the vacuum-tight container such that the vacuum-tight container is spaced from the pole piece and from the yoke.

2. The field-generating element of claim 1, wherein the vacuum-tight container surrounds the pole piece.

3. The field-generating element of claim 1, wherein the vacuum-tight container surrounds the yoke.

4. The field-generating element of claim 1, wherein the holder is configured to attach to a housing of a charged particle beam apparatus.

5. The field-generating element of claim 1, wherein the yoke comprises at least one opening, the holder extends through the at least one opening of the yoke, and a cross-section of the at least one opening is larger than a cross-section of the holder such that the holder is spaced from the yoke.

6. The field-generating element of claim 1, further comprising at least one shielding plate configured to limit a fringe field, the at least one shielding plate being spaced from the vacuum-tight container.

7. The field-generating element of claim 6, wherein the at least one shielding plate comprises at least one opening, the holder extends through the at least one opening of the shielding plate, and a cross-section of the at least one opening is larger than a cross-section of the holder such that the holder is spaced from the at least one shielding plate.

8. The field-generating element of claim 1, further comprising a duct adapted to provide a vacuum-tight conduit for fluid communication between the inside of the container and the outside of a column housing of a charged particle beam apparatus.

9. The field-generating element of claim 8, wherein the duct houses supply lines for the at least one coil.

10. The field-generating element of claim 8, wherein the duct is mountable between the container and the housing of the charged particle beam apparatus.

11. The field-generating element of claim 10, wherein the duct is mountable to the housing of the charged particle apparatus and affixable from outside the housing.

12. The field-generating element of claim 8, wherein the duct serves as the holder.

13. The field-generating element of claim 1, further comprising a duct comprising heat-conducting material and adapted to conduct heat from the inside of the container to a housing and/or to the outside of a charged particle beam apparatus.

14. The field-generating element of claim 1, wherein at least one additional coil is accommodated in the vacuum-tight container and configured to provide a corrective magnetic field.

15. The field-generating element of claim 1, wherein the pole piece comprises an elongated front piece.

16. The field-generating element of claim 1, wherein the pole piece serves as an electrode, is connected with a voltage source, and is electrically insulated from the yoke.

17. The field-generating element of claim 16, wherein the yoke is electrically insulated from the pole piece by an insulating foil and ceramic bushings.

18. The field-generating element of claim 1, wherein at least a portion of a rear surface of the pole piece is curved, wherein the curvature is adjusted to fit with a respective inner curvature of the yoke.

19. The field-generating element of claim 1, wherein a rear surface of the pole piece is planar.

20. The field-generating element of claim 1, wherein a rear surface of the pole piece comprises at least one elevated contact region configured to contact the yoke.

21. The field-generating element of claim 20, wherein the at least one elevated contact region is stripe-shaped.

22. The field-generating element of claim 20, wherein the at least one elevated contact region is point-shaped.

23. The field-generating element of claim 1, wherein the pole piece, the yoke, the container, and the holder are detachably connected to each other so that the field-generating element can be disassembled and reassembled to the same precision and accuracy.

24. A multipole element comprising a plurality of field-generating elements, each field-generating element comprising:
- a pole piece;
- a yoke connected with the pole piece;
- at least one coil;
- a vacuum-tight container containing the at least one coil; and
- a holder adapted to hold the vacuum-tight container such that the vacuum-tight container is spaced from the pole piece and from the yoke.

25. The multipole element of claim 24, wherein the number of field-generating elements is even.

26. The multipole element of claim 24, wherein the vacuum-tight containers of the field-generating elements are connected with each other to form a self-supporting structure.

27. The multipole element of claim 26, wherein the vacuum-tight containers of the field-generating elements are detachably connected with each other.

28. The multipole element of claim 24, wherein the vacuum-tight containers are electrically connected with each other by microconnectors.

* * * * *